(12) United States Patent
Tsutsui

(10) Patent No.: US 8,782,109 B2
(45) Date of Patent: Jul. 15, 2014

(54) ASYNCHRONOUS SAMPLE RATE CONVERSION USING A POLYNOMIAL INTERPOLATOR WITH MINIMAX STOPBAND ATTENUATION

(75) Inventor: Ryo Tsutsui, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 392 days.

(21) Appl. No.: 13/228,679

(22) Filed: Sep. 9, 2011

(65) Prior Publication Data

US 2012/0066280 A1  Mar. 15, 2012

Related U.S. Application Data

(60) Provisional application No. 61/381,508, filed on Sep. 10, 2010.

(51) Int. Cl.
*G06F 17/10* (2006.01)
*H03H 17/02* (2006.01)
*H03H 17/06* (2006.01)

(52) U.S. Cl.
CPC ......... *H03H 17/0628* (2013.01); *H03H 17/028* (2013.01); *H03H 17/0275* (2013.01)
USPC ........................................................ 708/313

(58) Field of Classification Search
None
See application file for complete search history.

(56) References Cited

U.S. PATENT DOCUMENTS

| | | | |
|---|---|---|---|
| 7,345,600 B1 | 3/2008 | Fedigan | |
| 7,415,493 B2 * | 8/2008 | Dahan ........................... | 708/313 |
| 8,405,532 B1 * | 3/2013 | Clark et al. ..................... | 341/61 |
| 2003/0172098 A1 * | 9/2003 | Jiang et al. ..................... | 708/313 |
| 2009/0077149 A1 * | 3/2009 | Tsutsui et al. ................. | 708/313 |
| 2009/0319065 A1 | 12/2009 | Risbo | |
| 2012/0066280 A1 * | 3/2012 | Tsutsui ........................... | 708/300 |

OTHER PUBLICATIONS

Sigmar Ries, "A Class of Sampling Rate Converters with Interesting Properties", Preprint 5827, presented at the 114th Convention of the Audio Engineering Society, Mar. 22-25, 2003, Amsterdam, The Netherlands, pp. 1-13.

Robert Adams and Tom Kwan, "Theory and VLSI Implementation of Asynchronous Sample-Rate Converters", Preprint 3570, presented at the 94th Convention of the Audio Engineering Society, Mar. 16-19, 1993, Berlin, Germany, pp. 1-42.

Dietmar Wenzel and Joachim Speidel, "A Digital Asynchronous Sample-Rate Converter for Digital Video Signals", IEEE Transactions on Consumer Electronics, vol. 46, No. 1, Feb. 2000, pp. 207-214.

* cited by examiner

*Primary Examiner* — David H Malzahn
(74) *Attorney, Agent, or Firm* — Mima Abyad; Frederick J. Telecky, Jr.

(57) ABSTRACT

Methods for sample rate conversion are provided that use a polynomial interpolator with minimax stopband attenuation. A method for sample rate conversion of an input signal is provided that uses a time-varying polyphase filter having a discrete polyphase index m. Another method for sample rate conversion of an input signal is provided that uses a time-varying polyphase filter having a continuous polyphase index τ. In these methods, an output time index is mapped to an input sample index and the polyphase index, the polynomial coefficients of a polyphase filter are computed using the polyphase index, and the polyphase filter is applied to an input sample at the input sample index to generate the output sample at the output time index.

16 Claims, 9 Drawing Sheets

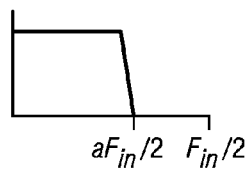
FIG. 3A
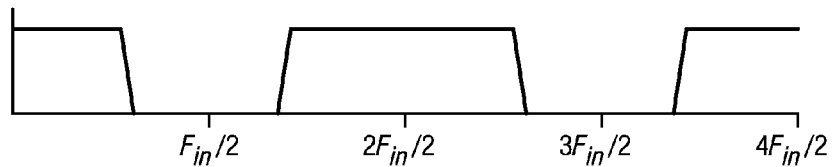
FIG. 3B
FIG. 3C
FIG. 3D
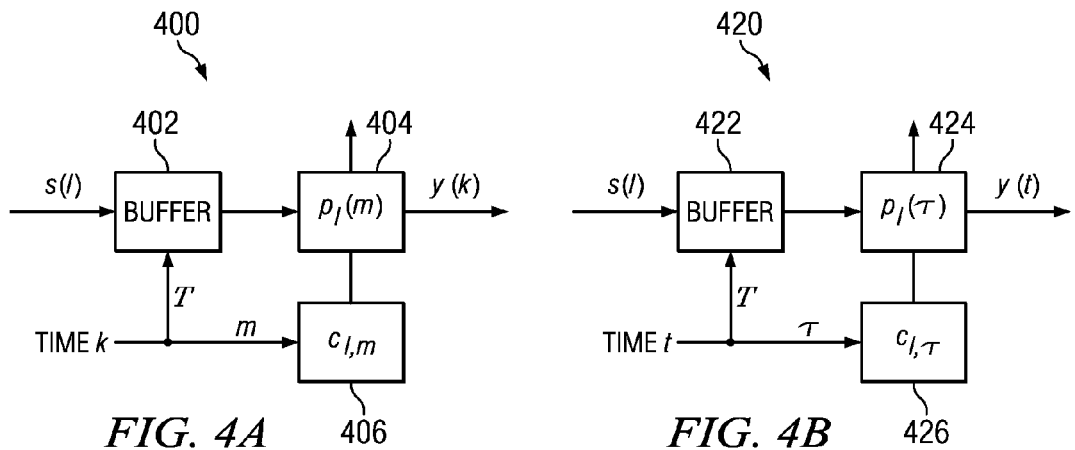
FIG. 4A
FIG. 4B

ASYNCHRONOUS SAMPLE RATE CONVERSION USING A POLYNOMIAL INTERPOLATOR WITH MINIMAX STOPBAND ATTENUATION

CROSS-REFERENCE TO RELATED APPLICATIONS

This application claims benefit of U.S. Provisional Patent Application Ser. No. 61/381,508, filed Sep. 10, 2010, which is incorporated by reference herein in its entirety.

BACKGROUND OF THE INVENTION

1. Field of the Invention

Embodiments of the present invention generally relate to asynchronous sample rate conversion using polynomial interpolation in digital signal processing.

2. Description of the Related Art

Many audio systems are required to handle audio streams with various sample rates, from the low rates found in many .WAV files such as 8 kHz to the high rates of consumer audio equipment such as 48 kHz. Rather than processing the audio at the sample rate of the audio signal, such audio systems may perform sample rate conversion (SRC) to convert an input sample rate to a common sample rate at which the processing is performed. For integer ratio sample rates, SRC can be performed by interpolation, low pass filtering, and decimation. However, filters for digital SRC can be cumbersome when input and output sample rates have a very large least common multiple, or the conversion ratio is irrational or slowly changing.

The irrational or slowly changing case is typically called an asynchronous sample rate conversion (ASRC), and a well-known conversion technique oversamples an input signal, converts it to a continuous signal by zeroth-order hold (ZOH), and then samples the continuous signal at the output sample period. However, to reduce ZOH distortion, the oversampling ratio has to be very large. For example, the ratio of $2^{16}$ has been reported to be adequate to achieve 16 bit accuracy. However, a large oversampling ratio requires a large number of filter coefficients and thus a larger amount of memory for storing the coefficients.

An alternative approach is to use polynomial interpolation. With polynomial interpolation, a fixed length of polynomial coefficients allows any high oversampling ratio up to infinity without loss of performance in terms of frequency response. Thus, ZOH is no longer necessary. Further, if the input signal bandwidth is known a priori to be narrow enough compared with the both input/output sample rates, a polynomial interpolator running stand-alone works sufficiently as a whole SRC system. If it is not the case, the polynomial interpolator can be used with a simple oversampler or downsampler. For example, United States Patent Publication No. 2009/0077149, entitled "Asynchronous Sampling Rate Conversion," presents an SRC system that first oversamples the input signal by an integer ratio, followed by a polynomial interpolator. United States Patent Publication No. 2009/0319065, entitled "Efficient Asynchronous Sample Rate Conversion," presents another example in which a polynomial interpolator first converts the input sample rate to multiple of the sample rate of the output, which is then processed with a simple downsampler. U.S. Patent Publication No. 2009/0077149 and U.S. Patent Publication No. 2009/0319065 are incorporated by reference herein in their entirety.

SUMMARY

Embodiments of the invention relate to methods for sample rate conversion of an input signal using a polynomial interpolator with minimax stopband attenuation. In one aspect, a method for sample rate conversion of an input signal is provided that uses a time-varying polyphase filter having a discrete polyphase index m. The method includes computing a discrete time index k at which an output sample is to be generated as a maximum integer result of Mt where M is an oversampling ratio and t is a time of the output sample, mapping the discrete time index k to an input sample index T and the discrete polyphase index m wherein k=TM+m, and applying a time-varying polyphase filter to an input sample at input sample index T to generate an output sample at the time index k, where the discrete polyphase index m is used together with a set of polynomials to compute the time-varying polyphase filter coefficients.

In another aspect, a method for sample rate conversion of an input signal is provided that uses a time-varying polyphase filter having a continuous polyphase index $\tau$. The method includes determining an output sample time t, mapping the output sample time t to an input sample index T and the continuous polyphase index $\tau$ where t=T+$\tau$, 0≤$\tau$<1, and applying a time-varying polyphase filter to an input sample at input sample index T to generate an output sample at the output sample time t, where the continuous polyphase index $\tau$ is used together with a set of polynomials to compute the time-varying polyphase filter coefficients.

BRIEF DESCRIPTION OF THE DRAWINGS

Particular embodiments in accordance with the invention will now be described, by way of example only, and with reference to the accompanying drawings:

FIGS. 3A-3D show example frequency spectrums;

FIGS. 4A and 4B show block diagrams of an SRC using, respectively, a discrete time polynomial interpolator and a continuous time polynomial interpolator;

DETAILED DESCRIPTION OF EMBODIMENTS OF THE INVENTION

Figure 1:
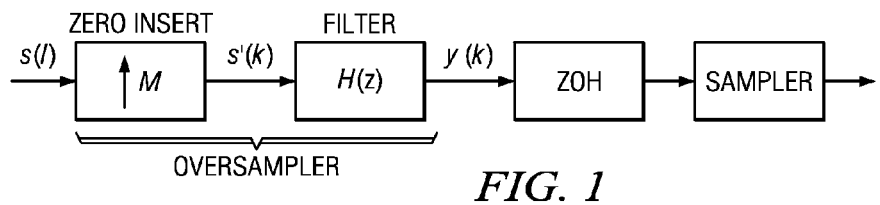
FIG. 1 shows a block diagram of a sample rate converter (SRC)

Specific embodiments of the invention will now be described in detail with reference to the accompanying figures. Like elements in the various figures are denoted by like reference numerals for consistency.

Embodiments of the invention provide sample rate conversion using a design method for a polynomial interpolator that minimizes stop-band error. That is, in contrast to prior art design methods, the new design method minimizes the highest stop-band ripple in the frequency domain. This is done by applying a weight function that is adaptively updated in each iteration of the weighted least squares polynomial fitting. The polynomial coefficients are optimized such that the frequency response of the polynomial filter is as close to the ideal response for audio SRC applications as possible. Due to its "minimax" characteristics, the new design method out performs other types of polynomial interpolators such as the polynomial interpolator described in U.S. Patent Publication No. 2009/0077149, B-Spline polynomical interpolators, and the Lagrange polynomial interpolators in terms of frequency response. Several modifications to the design method such as drooping of the pass-band response to further improve the stop-band attenuation and optimizations to reduce the computational load of the design method are also provided.

Figure 2A:
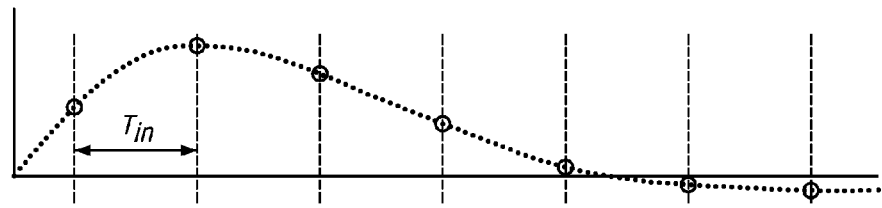
FIGS. 2A-2E show graphs of time domain signal behavior of the SRC of FIG. 1.
Figure 2B:
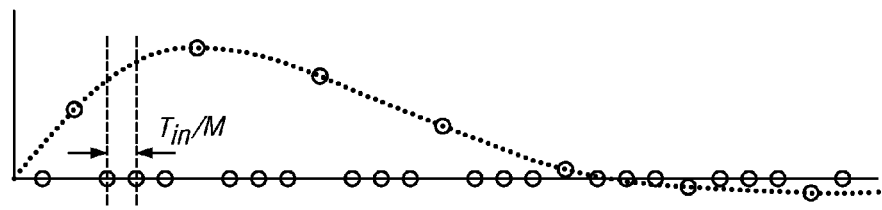
Figure 2C:
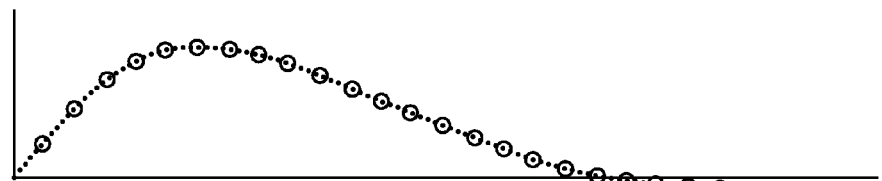

FIG. 1 shows a block diagram of a sample rate converter (SRC) that includes an oversampler, a zeroth-order hold (ZOH), and a sampler. FIGS. 2A-2E show the signal shapes after each processing step in FIG. 1. In FIGS. 2A-2E, the assumption is made that the bandwidth of the original continuous signal (the dotted curve in FIG. 2A) is limited so that it satisfies the sampling theorem with regards to the both of input and output sampling periods. The discrete input signal (the circle plots in FIG. 2A) is a time-discretized sequence of the continuous signal. To oversample the input signal by the ratio M (M=4 in FIGS. 2A-2E), first M−1 zeros are inserted between samples (FIG. 2B), and then a smooth oversampled signal is obtained using an oversampling filter (FIG. 2C).

Figure 2D:
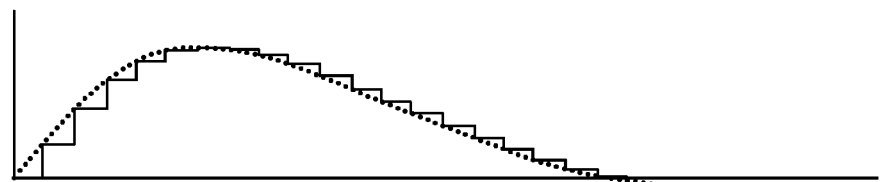
Figure 2E:
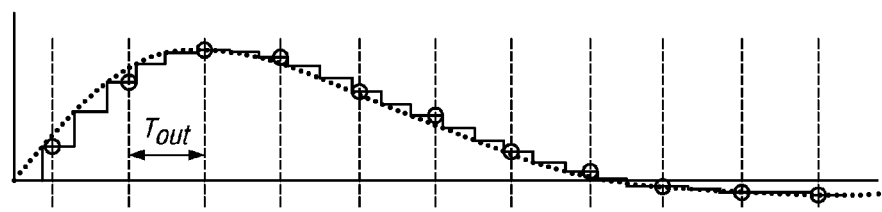

The oversampling filter plays a role of reducing the mirror components that were generated by the zero-insertion. ZOH is performed to simulate a pseudo continuous signal from the oversampled signal (FIG. 2D). Sampling the pseudo continuous signal at the output sampling period gives the output signal (FIG. 2E). As shown in FIG. 2E, the output signal exhibits visible errors with regards to the original continuous signal, which can be interpreted as a ZOH distortion. Thus, it can be estimated that a much higher oversampling ratio than M=4 would be needed to obtain more accurate results.

As FIG. 1 shows, the oversampler includes two stages, zero insertion of M−1 zeros and a filter H(z). Assume s(l) is an input signal sequence sampled at frequency $F_{in}$ in which the bandwidth has been limited to $\alpha F_{in}/2$ (as shown in FIG. 3A), where $\alpha<1$. The zero insertion inserts M−1 zeros between successive input samples to get s'(k), which is formulated by $$s'(k) = \begin{cases} s(l), & \text{for } k = lM \\ 0, & \text{otherwise.} \end{cases} \quad (1)$$

As can be seen in FIG. 3B, s'(k) exhibits unwanted mirror images at frequencies {f} such that $$\left| f - \frac{mF_{in}}{2} \right| \le \frac{\alpha F_{in}}{2}, \quad m = 2, 4, \ldots, M. \quad (2)$$

The mirror images can be eliminated by a low-pass filter H(z) that has stop-bands in such mirror regions (FIG. 3C). Let H(z) be a non-causal length 2LM FIR (finite impulse response) filter with coefficients h(k). The filtered signal y(k) is given as $$y(k) = \sum_{k'=-LM}^{LM-1} s'(k-k')h(k'). \quad (3)$$

As per FIG. 2E, given the output sample time t, a discrete time index k is determined by $$k = \lfloor Mt \rfloor, \quad (4)$$

where the $\lfloor \cdot \rfloor$ operator maps to the maximum integer that does not exceed the original value (i.e., truncation). Using the time index k, the signal y(k) is calculated and goes out as an output sample.

The above procedure illustrates a conceptual implementation of an SRC that is not used in practice because of the number of zero-multiplications of Eq. 3. Instead, a polyphase implementation of H(z) is typically employed to avoid such unnecessary calculations. When the index k at which an output sample is to be created is determined, the input sample index T and the polyphase index m can be uniquely determined such that $$k = TM+m, \quad 0 \le m < M. \quad (5)$$

Substituting Eq. 1 into Eq. 3, $$y(TM+m) = \sum_{k=-LM}^{LM-1} s'(TM+m-k)h(k) \quad (6)$$

$$= \sum_{l=-L}^{L-1} s(T-l)h(lM+m)$$

$$= \sum_{l=-L}^{L-1} s(T-l)p_l(m).$$

In Eq. 6, $p_l(m)$ is a set of M polyphase filters with length 2L and s(T−l) are the buffered input samples.

FIG. 3C suggests that H(z) is a special type of low-pass filter with a large number of don't-care bands in its frequency response. From Eq. 2, these don't-care bands are due to the input bandwidth that is known to be limited to $$\alpha \frac{F_{in}}{2},$$

where $\alpha<1$. U.S. Patent Publication No. 2009/0077149 suggests that the ROM size for storing $p_l(m)$ can be drastically reduced by replacing it with a polynomial, $$p_l(m) = \sum_{n=0}^{N} c_{l,n} \left(\frac{m}{M}\right)^n, \quad (7)$$

where N is the order of the polynomial. From Eq. 6, a class of polynomial interpolator is derived as $$y(TM+m) = \sum_{l=-L}^{L-1} s(T-l) \sum_{n=0}^{N} c_{l,n} \left(\frac{m}{M}\right)^n. \quad (8)$$

FIG. 4A shows a block diagram of this class of polynomial interpolator, i.e., a discrete time polynomial interpolator 400.

For each output time index k, indices T and m are calculated as per Eq. 4 and Eq. 5. The output sample time t can be determined by any means. For example, the output time t may be determined by computing $$t = l\frac{F_{in}}{F_{out}},$$

where l is the input sample count when the input/output sample rate ratio is fixed, or otherwise by an adaptive ratio tracker such as those found in U.S. Patent Publication No. 2009/0319065, U.S. Pat. No. 7,345,600, and D. Wenzel and J. Speidel, "A Digital Asynchronous Sample-Rate Converter for Digital Video Signals," IEEE Trans. Consumer Electronics, vol. 46, no. 1, pp. 207-214, February 2000.

Once t is determined, Eq. 4 is used to determine k and Eq. 5 is used to determine T and m. Then, as per Eq. 8, the index m is used by the coefficient calculator 406 to calculate the filter coefficients while the input sample index T determines the input samples from the buffer 402 to be processed with the polynomial filter 404 to produce the output signal y(k).

The interpolation formula of Eq. 8 can be extended to continuous interpolation. That is, once the fractional output time t is given, the output signal y(t) can be computed without time truncation to k. Similar to Eq. 5, there is a unique projection of t to integer part T and fractional part τ, such that $$t=T+\tau,\ 0\leq\tau<1. \quad (9)$$

Then, Eq. 8 is modified to $$y(T+\tau) = \sum_{l=-L}^{L-1} s(T-l)\sum_{n=0}^{N} c_{l,n}\tau^n. \quad (10)$$

Thus, the ZOH module (see FIG. 1) is no longer necessary and hence the SRC is free from ZOH distortion.

FIG. 4B shows a block diagram of this class of polynomial interpolator, i.e., a continuous time polynomial interpolator 420. The output time t can be determined by any means. For example, the output time t may be determined as previously describer herein. Once t is determined, Eq. 9 is used to project it to T and τ. The index T determines the input sample index that is provided to the polynomial interpolator 424 from the buffer 422, while the fractional polyphase index τ is used by the coefficient calculator 426 to compute the time-varying FIR filter coefficients.

The SRC systems 400 of FIGS. 4A and 420 of FIG. 4B operate efficiently if the input signal is sufficiently band-limited. However, modification to the SRC system is needed to improve efficiency if the input signal is not sufficiently band-limited, i.e., α can go up to 1, so that the filter H(z) does not have any don't-care regions, or the cut-off frequency of the input signal can be higher than the Nyquist frequency of the output, in which case the sampler module in of FIG. 1 causes aliasing. Typically, this latter condition is true when the conversion ratio of the SRC is below 1 (downsampling).

Figure 5:
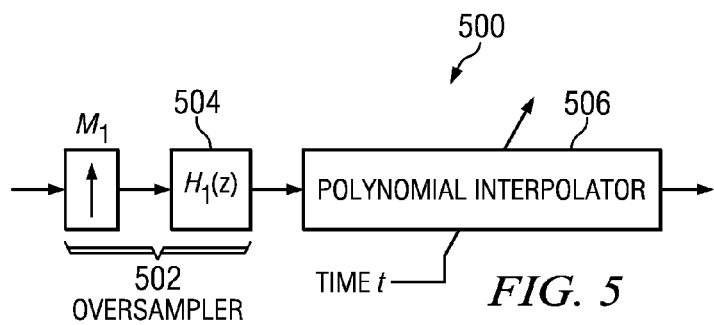
FIG. 5 shows a block diagram of an SRC using a polynomial interpolator and a preceding oversampler.

U.S. Patent Publication No. 2009/0077149 discloses an SRC system 500 as shown in FIG. 5. The polynomial interpolator module 506 in FIG. 5 may be that of FIG. 4A or FIG. 4B. The preceding oversampler module 502 oversamples the input signal by a fixed ratio $M_1$, which lowers the input bandwidth by $M_1$ regarding the Nyquist frequency. This is equivalent to reducing $\alpha=1/M_1$ in FIG. 3. The preceding oversampler module 502 may implement any suitable filter 504 such as, for example, an IIR or a polyphase FIR. This SRC system 500 works for any conversion ratio above 1, i.e., for upsampling. However, when the conversion ratio is below 1, i.e., for downsampling, an anti-aliasing filter should be appended to prevent aliasing due to the downsampling.

Figure 6:
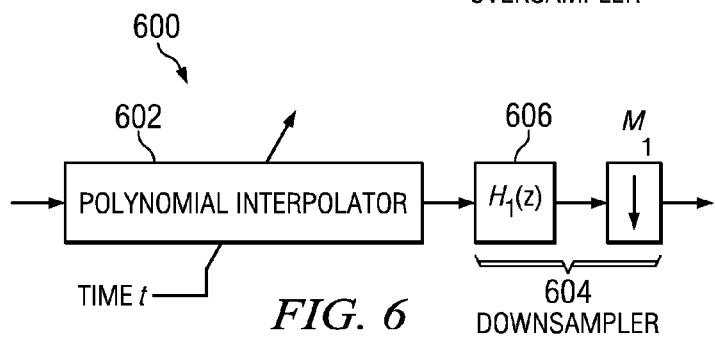
FIG. 6 shows a block diagram of an SRC using a polynomial interpolator and a following downsampler.
Figure 7A:
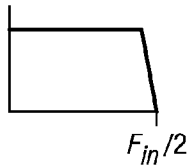
FIGS. 7A-7F show example frequency spectrums of the SRC of FIG. 6.
Figure 7B:
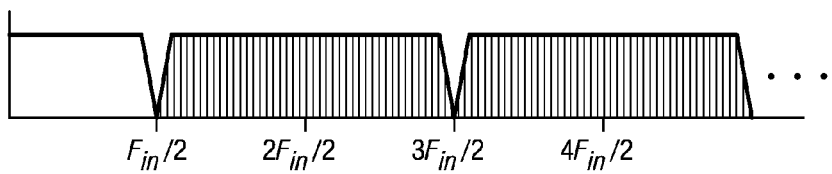
Figure 7C:
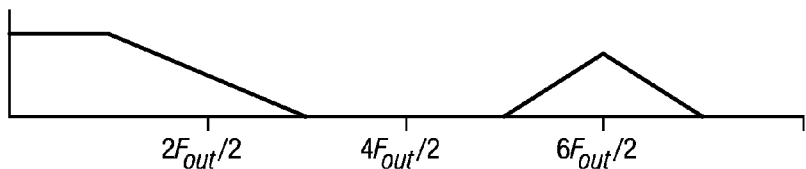
Figure 7D:
Figure 7E:
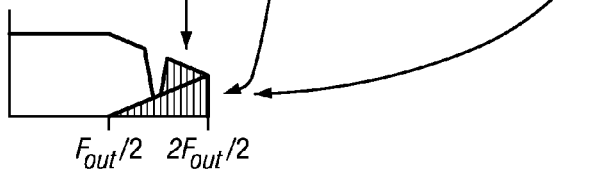
Figure 7F:
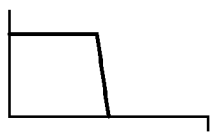

U.S. Patent Publication No. 2009/0319065 discloses an SRC system 600 as shown in FIG. 6. The polynomial interpolator module 602 converts the input sample rate to a multiple of the output sample rate and the following downsampler module 604 downsamples this rate to the output sample rate. FIGS. 7A-7F illustrate the conceptual behavior of the SRC system 600. In these figures, $F_{out}$ is the output sample frequency and $F_{in}$ is the input sample frequency. On the way to sampling at $M_1F_{out}$, mirror images of the input signal are generated around the multiple of the input sample frequency (FIG. 7B), which are then processed by the polynomial filter (FIG. 7C), leaving mirror images around the multiple of $M_1F_{out}$ (FIG. 7D). When sampling the filtered signal at $M_1F_{out}$, these mirror images are mapped under $M_1F_{out}/2$ as aliasing, but they are concentrated in the range between $F_{out}/2$ and $M_1F_{out}/2$ (FIG. 7E). The downsampling filter module $H_1(z)$ 606 eliminates anything above $F_{out}/2$ and creates the output signal sampled at $F_{out}$ (FIG. 7F).

The SRC system 600 works for any conversion ratio for downsampling. However, for upsampling, an anti-mirror filter should be appended to eliminate the mirror images remaining in the range $[F_{in}/2,\mu F_{out}/2]$.

Figure 8:
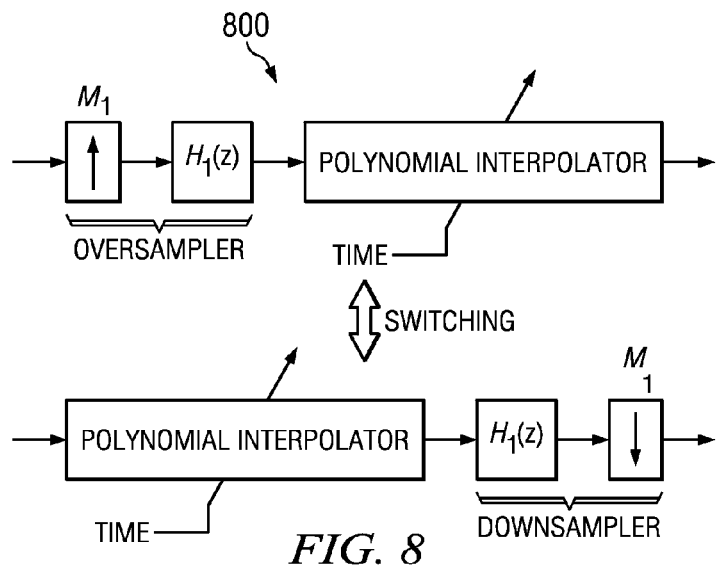
FIG. 8 shows a block diagram of an SRC using a configurable polynomial interpolator connection.

As previously mentioned, the SRC system 500 of FIG. 5 is best suited for upsampling applications while the SRC system 600 of FIG. 6 is best suited for downsampling applications. U.S. Patent Publication No. 2009/0319065 also discloses an SRC system 800 that switches between two SRC subsystems depending on the conversion ratio, as shown in FIG. 8. As shown in FIG. 8, one of the SRC subsystems is the SRC system of FIG. 5 and the other is the SRC system of FIG. 6. With such a switchable system, neither an anti-aliasing or an anti-mirror filter is needed. Further, both SRC subsystems can share the same filter coefficients for the polynomial interpolators and the filters $H_1(z)$.

Figure 9:
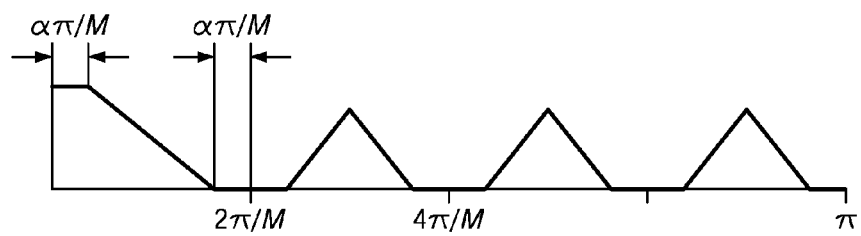
FIG. 9 shows an example of an ideal response of a polynomial filter.

Several possible SRC systems that incorporate a polynomial interpolator have been described. A design method for a polynomial filter that may be used in such SRC systems is now derived. FIG. 9 shows the ideal response of a polynomial filter H (z) equivalent to FIG. 3C and FIG. 7C. The horizontal axis is the angular frequency ω. FIG. 9 suggests that the ideal response of a polynomial filter is given as $$H(e^{j\omega}) = \begin{cases} M, & \left|\omega - \frac{2\pi\lambda}{M}\right| \leq \frac{\alpha\pi}{M}, \ \lambda = 0 \\ 0, & \left|\omega - \frac{2\pi\lambda}{M}\right| \leq \frac{\alpha\pi}{M}, \ \lambda = 1, 2, \ldots, M-1 \\ \text{don't-care} & \text{otherwise.} \end{cases} \quad (11)$$

As per Eq. 6, the definition of the set of polyphase filters $p_l(m)$ is given by $$p_l(m)=h(lM+m). \quad (12)$$

The Fourier transform of $p_l(m)$, $P(m,e^{j\omega})$ may be calculated to be $$P(m, e^{j\omega}) = \sum_{l=-L}^{L-1} p_l(m)e^{-j\omega l} = \frac{1}{M}\sum_{\lambda=0}^{M-1} e^{j\frac{\omega+2\pi\lambda}{M}m} H(e^{j\frac{\omega+2\pi\lambda}{M}}) \qquad (13)$$

where $j^2 = -1$. Using Eq. 11 and Eq. 13, the ideal response of the polyphase filter $\tilde{P}(m,e^{j\omega})$ is given as $$\tilde{P}(m, e^{j\omega}) = \begin{cases} e^{j\frac{\omega}{M}m}, & |\omega| \le \alpha\pi \\ \text{don't-care}, & \text{otherwise.} \end{cases} \qquad (14)$$

The actual frequency response of the polyphase filter $p_l(m)$ after using the polynomial interpolator of Eq. 7 is $$P(m, e^{j\omega}) = \sum_{l=-L}^{L-1} p_l(m)e^{-j\omega l} = \sum_{l=-L}^{L-1}\sum_{n=0}^{N} c_{l,n}\left(\frac{m}{M}\right)^n e^{-j\omega l}. \qquad (15)$$

Thus, the design problem reduces to an optimization problem for $c_{l,n}$ such that $$J = \|\epsilon_m(e^{j\omega})\| \qquad (16)$$

is minimized, where $\epsilon$ is the error function defined by $$\epsilon_m(e^{j\omega}) = \tilde{P}(m,e^{j\omega}) - P(m,e^{j\omega}). \qquad (17)$$

Eq. 16 may be solved in the minimax sense, i.e., by iterating the weighted least squares solution while adaptively updating the weight function. For the least squares solution, Eq. 16 can be rewritten as $$J = \sum_{m=0}^{M-1} \int_{-\alpha\pi}^{\alpha\pi} \varepsilon_m(e^{j\omega})\varepsilon_m(e^{j\omega})^* W(\omega)d\omega, \qquad (18)$$

where $W(\omega)$ is the weight function and * denotes the conjugate. The least-squares solution is derived by taking partial derivatives of Eq. 18 with respect to $c_{l,n}$, and setting the results to zero. Using the relationship $$\frac{\partial}{\partial c_{l,n}}\varepsilon_m(e^{j\omega}) = -\left(\frac{m}{M}\right)^n e^{-j\omega l}, \qquad (19)$$

which can be derived from Eq. 15 and Eq. 17, we can write $$\sum_{m=0}^{M-1} \int \left(\frac{m}{M}\right)^n \{e^{j\omega l}\varepsilon_m(e^{j\omega}) + e^{-j\omega l}\varepsilon_m(e^{j\omega})^*\}W(\omega)d\omega = 0. \qquad (20)$$

Substitution of Eq. 15 and Eq. 17 into Eq. 20 with significant simplification provides $$\sum_{l'=-L}^{L-1}\sum_{n'=0}^{N} a(n+n')b(l-l')c_{l',n'} = \sum_{m=0}^{M-1} \left(\frac{m}{M}\right)^n b\left(l+\frac{m}{M}\right), \qquad (21)$$

for $n=0, \ldots, N$ and $l=-L, \ldots, L-1$, where functions $a(n)$ and $b(x)$ respectively are defined by $$a(n) = \sum_{m=0}^{M-1} \left(\frac{m}{M}\right)^n \qquad (22)$$

and $$b(x) = \int_0^{\alpha\pi} W(\omega)\cos(\omega x)d x. \qquad (23)$$

Figure 10:
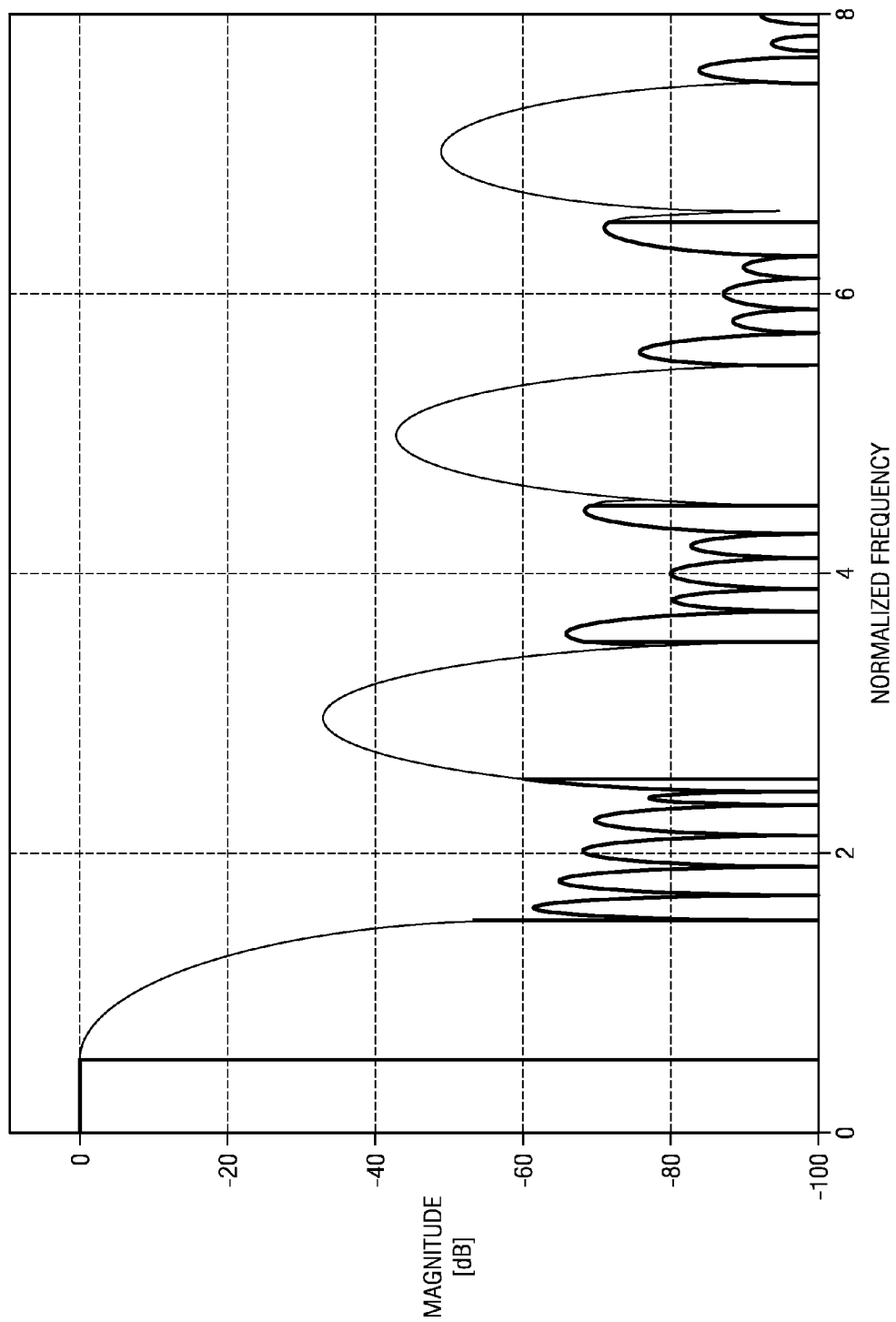
FIGS. 10-12 show graphs of the frequency response of different polynomial filters.

FIG. 10 shows the frequency response of a polynomial interpolator based on the least squares fitting, with $\alpha=0.5$, $L=3$, $N=3$, and $W(\omega)=1$. The horizontal axis is normalized by $\pi$ and the graph shows the first $8\pi$ of the frequency range. As this figure shows, there is larger error around the band edge of stop-bands. The design method attempts to apply a higher weight for such frequencies in order to distribute the error as equally as possible. This is done by first evaluating the error function after the least-square fitting, and then using the error function to update the weight function.

After solving Eq. 21, the frequency response $H(e^{j\omega})$ of the polynomial interpolator is calculated. As per Eq. 7 and Eq. 12, $H(e^{j\omega})$ may be calculated as $$\begin{aligned}H(e^{j\omega}) &= \sum_{l=-L}^{L-1}\sum_{m=0}^{M-1} h(m+Ml)e^{-j\omega\frac{m+Ml}{M}} \\ &= \sum_{l=-L}^{L-1}\sum_{m=0}^{M-1}\sum_{n=0}^{N} \left(\frac{m}{M}\right)^n c_{l,n} e^{-j\omega\frac{m+Ml}{M}} \\ &= \sum_{l=-L}^{L-1}\sum_{n=0}^{N} Q_n(e^{j\omega})c_{l,n}e^{-j\omega l},\end{aligned} \qquad (24)$$

where $$Q_n(e^{j\omega}) = \sum_{m=0}^{M-1} \left(\frac{m}{M}\right)^n e^{-j\frac{m}{M}\omega}. \qquad (25)$$

In stop bands, the frequency response $H(e^{j\omega})$ directly indicates the error function, as the ideal response is zero there.

The weight function $W(\omega)$ cannot be controlled over all stop-bands because $W(\omega)$ is defined in the range $0 \le \omega \le \alpha\pi$, while there are stop-bands in $k\pi-\alpha\pi \le \omega \le k\pi+\alpha\pi$, $k=2, 4, \ldots$. Therefore, the errors lying in these regions are mapped onto $0 \le \omega \le \alpha\pi$. This can be done by taking the maximum error among $k=2, 4, \ldots$. In other words, the error function defined by $$E(\omega) = \max_{k=2,4,\ldots} \{\max\{|H(e^{j(k\pi+\omega)})|, |H(e^{j(k\pi-\omega)})|\}\} \qquad (26)$$

is evaluated for $0 \le \omega \le \alpha\pi$, where $H(e^{j\omega})$ is defined by Eq. 24.

Then, the polynomial coefficients may be iteratively optimized as follows. At the first iteration $\rho=1$, set $W_1(\omega)=1$ for $0 \le \omega \le \alpha\pi$. For each iteration until convergence is reached, solve Eq. 21, calculate the error function as per Eq. 26, and update $W_\rho(\omega)$ for the next iteration, using $W_{\rho+1}(\omega)=W_\rho(\omega)E(\omega)$, $0 \le \omega \le \alpha\pi$. After each iteration, check for convergence. If convergence has not been reached, update $\rho \leftarrow \rho+1$ and perform another iteration. Any suitable test for convergence may be used. For example, convergence may be found when the difference between the maximum and minimum in $E(\omega)$ is under a threshold or the change in $c_{l,n}$ is under a threshold.

Figure 11:
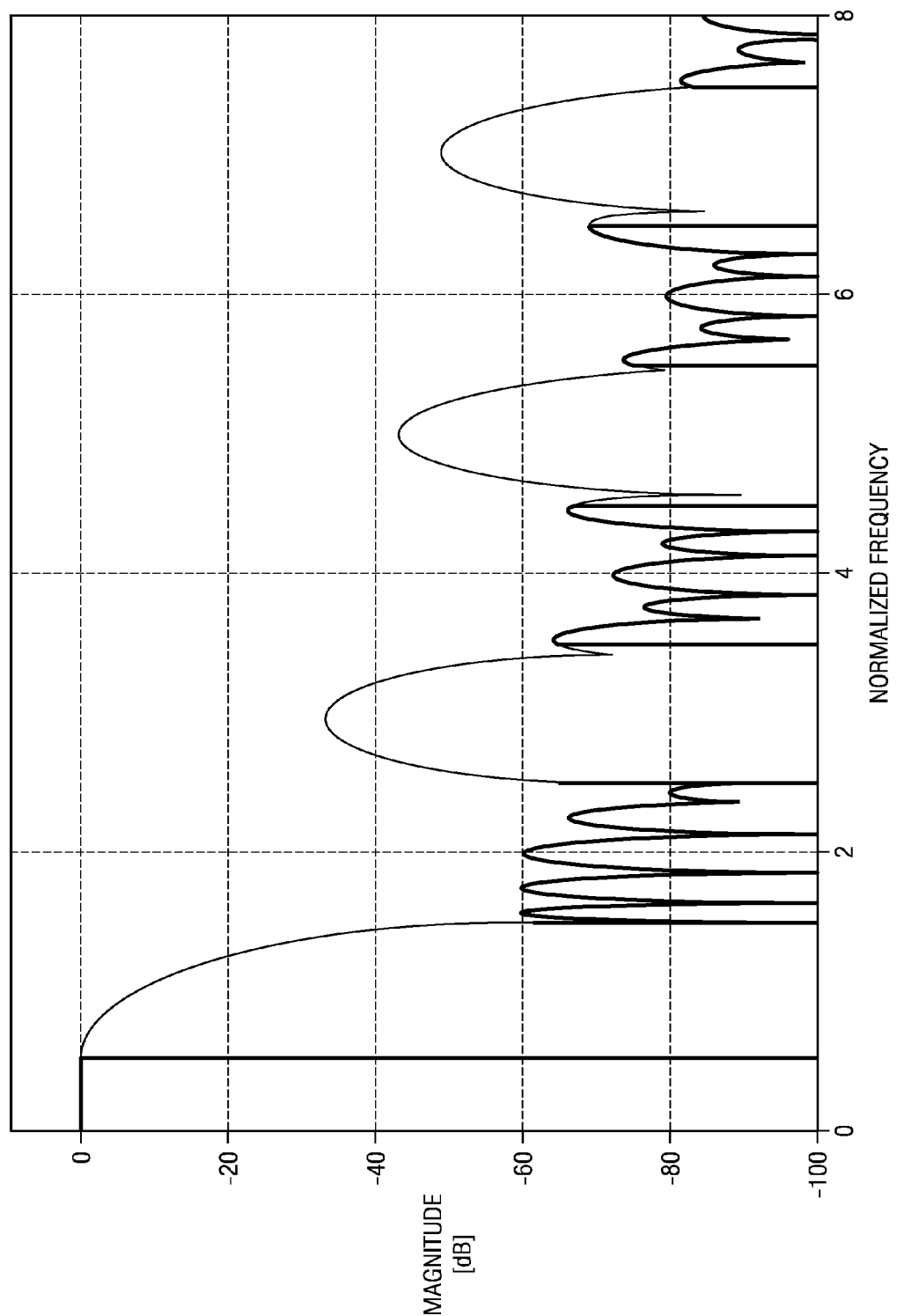

FIG. 11 shows the frequency response resulting from the above optimization for the same parameters used for FIG. 10. This figure shows that the error gives the minimax response in the frequency range $[2\pi-\alpha\pi, 2\pi]$. This figure also shows that the maximum stop-band error is improved from −53 dB to −60 dB compared to the least squares solution.

As disclosed in U.S. Patent Publication No. 2009/0077149, the stop-band attenuation can be improved by shaping the pass-band of the interpolator with a droop curve. The pass-band droop is acceptable when the polynomial interpolator is used with an additional oversampler or downsampler, namely $H_1(z)$ as in FIG. 5, FIG. 6, and FIG. 8, as the droop curve can be compensated by $H_1(z)$.

To allow the minimax polynomial interpolator to have a droop shape in the pass-band, the ideal response of the polynomial filter that was given by Eq. 11 is modified to $$H(e^{j\omega}) = \begin{cases} MD(\omega), & \left|\omega - \frac{2\pi\lambda}{M}\right| \leq \frac{\alpha\pi}{M}, \quad \lambda = 0 \\ 0, & \left|\omega - \frac{2\pi\lambda}{M}\right| \leq \frac{\alpha\pi}{M}, \quad \lambda = 1, 2, \ldots, M-1 \\ \text{don't-care}, & \text{others}, \end{cases} \quad (27)$$

where $D(\omega)$ represents the droop function. By substituting Eq. 27 into Eq. 13, the ideal polyphase filter response of Eq. 14 is modified to $$\tilde{P}(m, e^{j\omega}) = \begin{cases} D(\omega)e^{j\frac{\omega}{M}m}, & |\omega| \leq \alpha\pi \\ \text{don't-care}, & \text{otherwise}. \end{cases} \quad (28)$$

After working on Eq. 28 with the same procedures described above for the weighted least squares solution, a modified linear equation regarding the polynomial coefficients is obtained, i.e., $$\sum_{l'=-L}^{L-1} \sum_{n'=0}^{N} a(n+n')b(l-l')c_{l',n'} = \sum_{m=0}^{M-1} \left(\frac{m}{M}\right)^n d\left(l + \frac{m}{M}\right), \quad (29)$$

where $a(n)$ and $b(x)$ respectively are defined by Eq. 22 and Eq. 23, and $d(x)$ is defined by $$d(x) = \int_0^{\alpha\pi} D(\omega)W(\omega)\cos(\omega x)dx. \quad (30)$$

The minimax solution of the droop filter may be found in a similar fashion to the minimax solution of the filter without the droop curve using Eq. 29 instead of Eq. 21.

Figure 12:
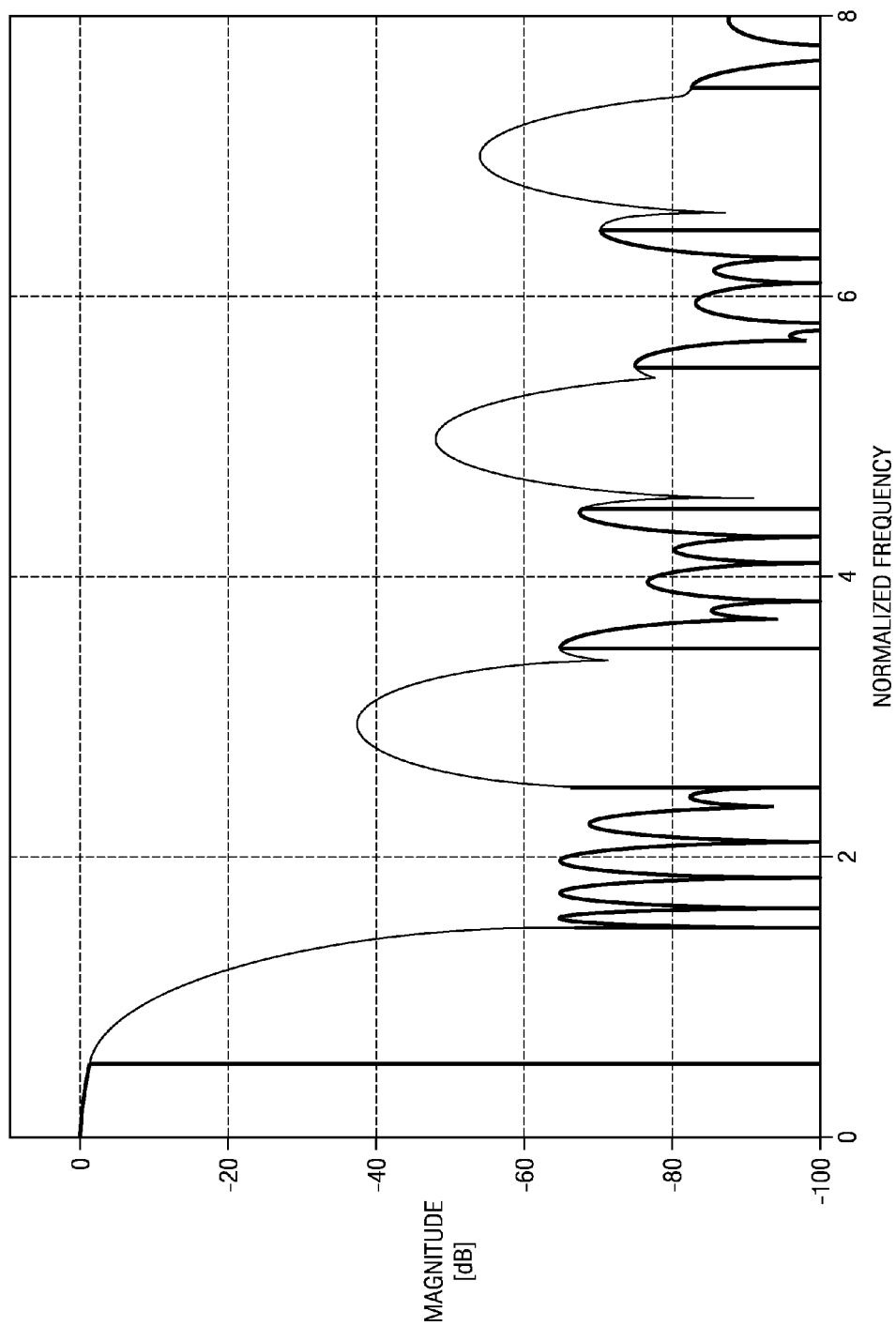

FIG. 12 shows the frequency response resulting from the droop version of polynomial filter with the same parameters used for FIG. 11 where the droop function $D(\omega)$ is expressed as $$D(\omega) = 1 - 0.05\omega^2.$$

This figurer shows that the pass-band edge was reduced to to $1-0.05(\alpha\pi)^2$, or −1.14 dB and the maximum stop-band error was reduced to −65 dB.

Thus far, the oversampling ratio M has been assumed to be a finite value in the filter design process. Polynomial filters so designed can work for oversampling signals by any high M values up to infinity, without loss of stop-band performance. This can visually be understood in FIGS. 10-12 that illustrate that the stop-band level becomes lower in higher frequencies. In fact, stop-band level was observed to be even lower in frequency range $\omega > 8\pi$.

In spite of the above fact, it is still interesting to modify the design method to allow $M \to \infty$ in the design process. To do this, Eq. 21 and Eq. 22 are normalized by M and let $M \to \infty$ which results in $$\sum_{l'=-L}^{L-1} \sum_{n'=0}^{N} a'(n+n')b(l-l')c_{l',n'} = \int_0^1 x^n b(l+x)dx, \quad (31)$$

where $$a'(n) = \int_0^1 x^n dx = \frac{1}{1+n}. \quad (32)$$

For the droop version of polynomial interpolator, Eq. 31 applies with the replacement of $b(x)$ with $d(x)$, i.e., $$\sum_{l'=-L}^{L-1} \sum_{n'=0}^{N} a'(n+n')b(l-l')c_{l',n'} = \int_0^1 x^n d(l+x)dx, \quad (33)$$

Also in the optimization process, the frequency response of $H(e^{j\omega})$ in Eq. 24 is modified to $$H(e^{j\omega}) = \sum_{l=-L}^{L-1} \sum_{n=0}^{N} Q_{n'}(e^{j\omega})c_{l,n}e^{-j\omega l}, \quad (34)$$

where $$Q_{n'}(e^{j\omega}) = \int_0^1 x^n e^{-j\omega x}dx. \quad (35)$$

At each iteration of the coefficient optimization, one of the sets of linear equations of Eq. 21, Eq. 29, Eq. 31, and Eq. 33 is solved, which are order of $2L(N+1)$. When L and N increase, directly solving these equations will require increased computation time which could be a problem in some applications. For example, the Gaussian elimination and Cholesky decomposition take $O((LN)^3)$ to solve those equations. One solution is to factorize the linear equations.

The equations Eq. 21, Eq. 29, Eq. 31, and Eq. 33 can be rewritten with the following generalized formula:

$$\sum_{l'=-L}^{L-1} \sum_{n'=0}^{N} a_{n+n'}b_{l-l'}c_{l',n'} = f_{l,n}. \quad (36)$$

The vector-matrix expression of Eq. 36 is $$Gc = f, \quad (37)$$

where

-continued $$G = \begin{bmatrix} a_N b_0 & \cdots & a_N b_{2L-1} & & a_0 b_0 & \cdots & a_0 b_{2L-1} \\ \cdots & & \cdots & & & \cdots & \\ a_N b_{2L-1} & \cdots & a_N b_0 & & a_0 b_{2L-1} & \cdots & a_0 b_0 \\ \vdots & & & & & & \vdots \\ a_{2N} b_0 & \cdots & a_N b_{2L-1} & & a_N b_0 & \cdots & a_N b_{2L-1} \\ \cdots & & \cdots & & & \cdots & \\ a_{2N} b_{2L-1} & \cdots & a_N b_0 & & a_N b_{2L-1} & \cdots & a_N b_0 \end{bmatrix},$$

$$c = [\, c_{-L,N} \;\cdots\; c_{L-1,N} \;\cdots\; c_{-L,0} \;\cdots\; c_{L-1,0} \,]^T,$$

$$f = [\, f_{-L,0} \;\cdots\; f_{L-1,0} \;\cdots\; f_{-L,N} \;\cdots\; f_{L-1,N} \,]^T,$$

and $^T$ denotes transpose. Note that here the relationship $b_{-x} = b_x$ is used, which is obvious because of Eq. 23.

The matrix G is factorized to $$G = \begin{bmatrix} B & & & 0 \\ & B & & \\ & & \ddots & \\ 0 & & & B \end{bmatrix} \begin{bmatrix} a_N I & a_{N-1} I & \cdots & a_0 I \\ a_{N+1} I & a_N I & \cdots & a_1 I \\ \vdots & \vdots & \ddots & \vdots \\ a_{2N} I & a_{2N-1} I & \cdots & a_N I \end{bmatrix},$$

where $$B = \begin{bmatrix} b_0 & b_1 & \cdots & b_{2L-1} \\ b_1 & b_0 & \cdots & b_{2L-2} \\ \vdots & \vdots & \ddots & \vdots \\ b_{2L-1} & b_{2N-2} & \cdots & b_0 \end{bmatrix}$$

and I is the 2L×2L identity matrix. Therefore, the solution of the above linear equations may be found as follows. First, solve the order-2L linear equations $$\begin{bmatrix} b_0 & b_1 & \cdots & b_{2L-1} \\ b_1 & b_0 & \cdots & b_{2L-2} \\ \vdots & \vdots & \ddots & \vdots \\ b_{2L-1} & b_{2N-2} & \cdots & b_0 \end{bmatrix} \begin{bmatrix} \phi_{0,n} \\ \phi_{1,n} \\ \vdots \\ \phi_{2L-1,n} \end{bmatrix} = \begin{bmatrix} f_{-L,n} \\ f_{-L+1,n} \\ \vdots \\ f_{L-1,n} \end{bmatrix} \quad (38)$$

for $\phi_{l,n}$, n=0, 1, . . . , N. Then, solve the order-N+1 linear equations $$\begin{bmatrix} a_N & a_{N-1} & \cdots & a_0 \\ a_{N+1} & a_N & \cdots & a_1 \\ \vdots & \vdots & \ddots & \vdots \\ a_{2N} & a_{2N-1} & \cdots & a_N \end{bmatrix} \begin{bmatrix} c_{l,N} \\ c_{l,N-1} \\ \vdots \\ c_{l,0} \end{bmatrix} = \begin{bmatrix} \phi_{l,0} \\ \phi_{l,1} \\ \vdots \\ \phi_{l,N} \end{bmatrix} \quad (39)$$

for $c_{l,n}$, l=−L, −L+1, . . . , L−1.

Both Eq. 38 and Eq. 39 can be solved by using the Levinson algorithm, as the coefficient matrices have toeplitz structure. As the Levinson algorithm takes $O(N^2)$ of computational load for solving order-N equations, the entire computational load of solving Eq. 38 and Eq. 39 will be $O(LN(L+N))$, which is significant savings as compared with the other solutions such as Gaussian elimination and Cholesky factorization which take $O((LN)^3)$.

Figure 13A:
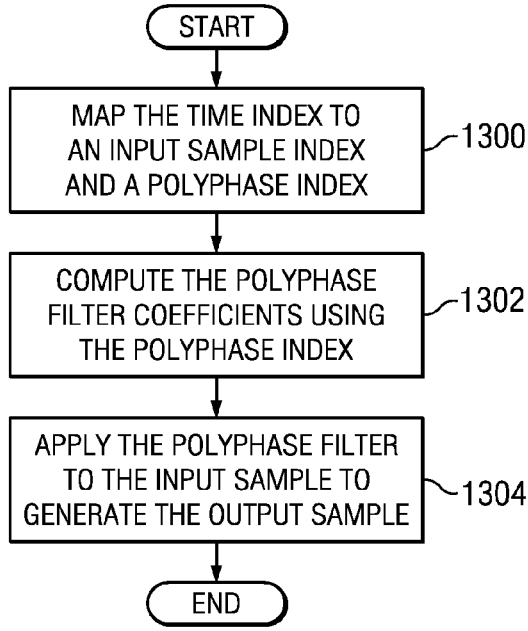
FIGS. 13A and 13B show flow diagrams of a method for sample rate conversion.

FIG. 13A shows a flow diagram of a method for sample rate conversion using the polyphase filter $p_l(m)$. The method is performed at a time index t when an output sample is to be generated to convert an input sample at one rate to an output sample of another rate. Initially, the time index is mapped to an input sample index and a polyphase index 1300. If the output timing is discrete, the mapping is performed as per Eq. 4 and Eq. 5. If the output timing is continuous, the mapping is performed as per Eq. 9.

The polyphase filter coefficients $p_l(m)$ are then computed using the polyphase index 1302 and the polynomial coefficients $c_{l,n}$ as per Eq. 7. A method for computing the polynomial coefficients $c_{l,n}$ is described below in relation to FIG. 13B. The polyphase filter $p_l(m)$ is then applied to the input sample to generate the output sample 1304.

Figure 13B:
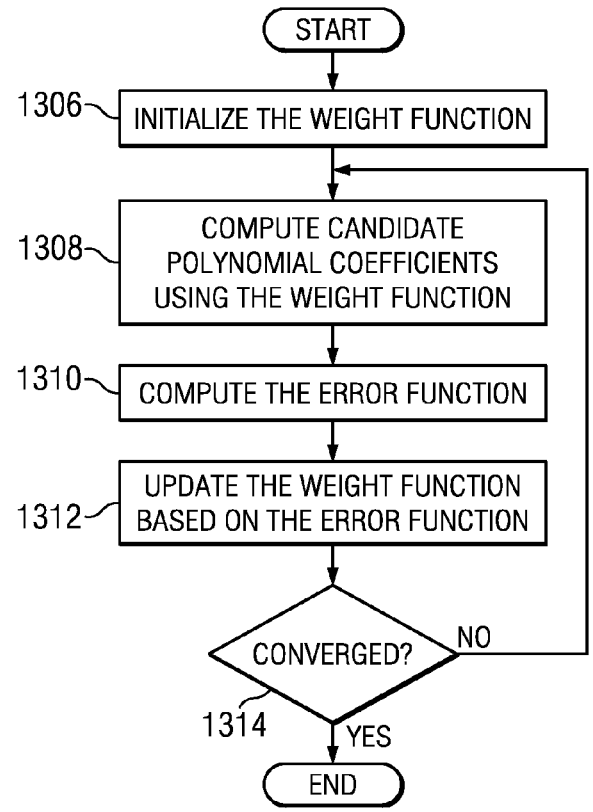

FIG. 13B shows a flow diagram of a method for computing the polynomial coefficients through iterative optimization. First, the weight function for the initial iteration is initialized, i.e., $W_1(\omega)=1$ for $0 \le \omega \le \alpha\pi$ 1306. Candidate coefficient values are then computed using the weight function 1308. The computation may be performed as per Eq. 21, or, if the pass-band of the interpolator is shaped with a droop curve, as per Eq. 29. The error function is then computed as per Eq. 26 1310 and the weight function is updated based on the error function 1312, i.e., $W_{\rho+1}(\omega)=W_\rho(\omega)E(\omega)$, $0 \le \omega \le \alpha\pi$ where $\rho$ is the iteration number. If the solution is not converged 1314, the process is repeated with the updated weight function. Otherwise, the candidate coefficients from the current iteration are returned for use in the polyphase filter.

Figure 14:
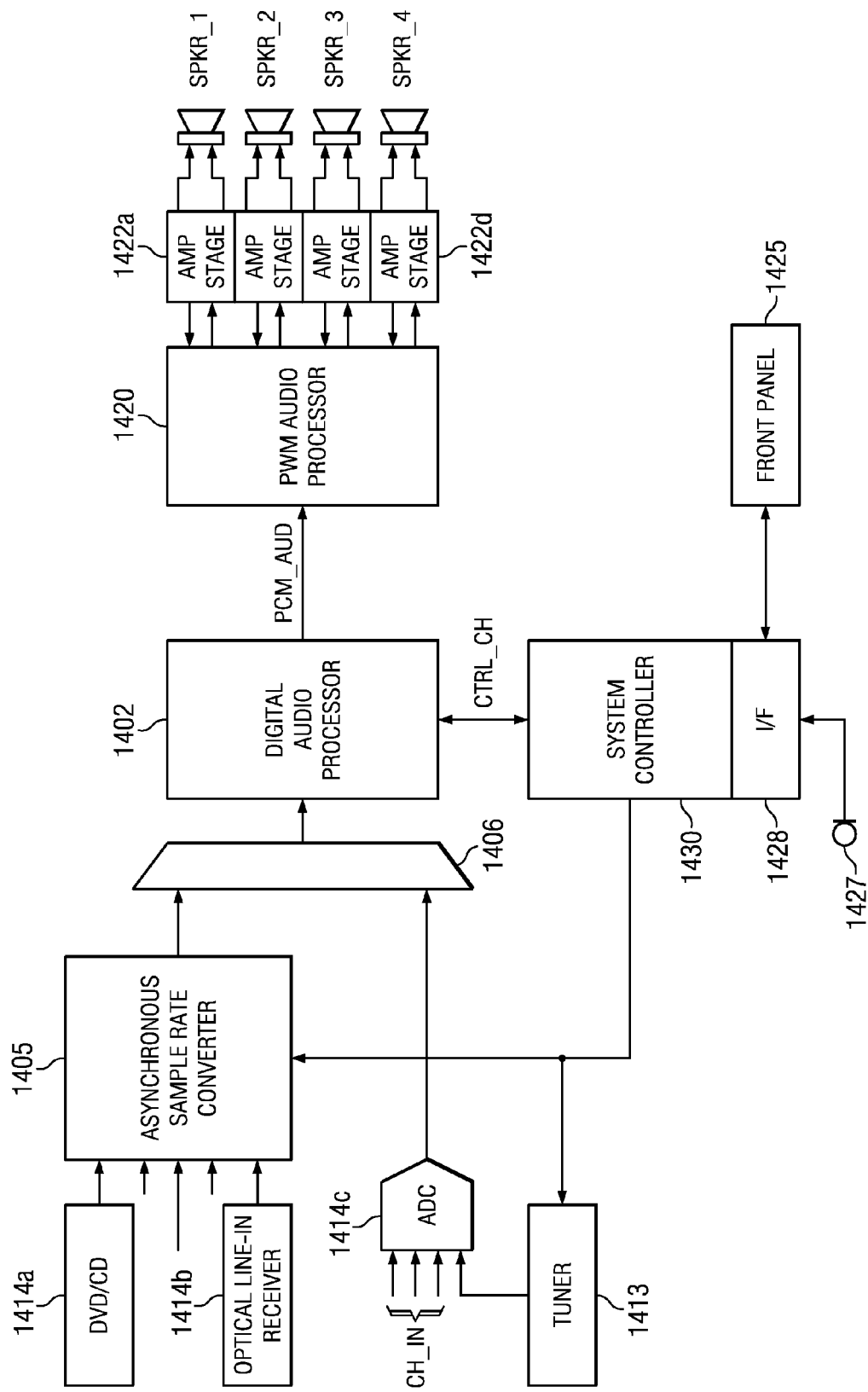
FIG. 14 shows a block diagram of an example digital audio receiver.

FIG. 14 shows a block diagram of example audio processing circuitry in a digital audio receiver. The digital audio receiver may be part of an audio-video receiver, in which case video data paths (not shown) will also be provided. In this example, asynchronous sample rate converter (ASRC) 1405 receives digital audio from a DVD/CD controller 1404a, and an optical line-in receiver 1404b. Other digital inputs are also provided to ASRC 1405, as suggested in FIG. 14. Thus, the sample rates of the various input sample streams (i.e., discrete time signals) may vary over a relatively wide range. For example, the output of DVD/CD controller 1404a for CD audio is typically at a sample rate of 44.1 kHz, while the audio output for DVD audio is at a sample rate of 96 kHz. Other input sources, such as digital radio, digital audio tape, digital signals from a computer or MP3 player, and the like can provide audio signals at varying sample rates. As such, modern digital audio receivers such as the receiver of FIG. 14 are capable of receiving digital audio at sample rates ranging from 11 kHz to as high as 192 kHz (for DVD-A audio).

The ASRC 1405 includes functionality to perform a sample rate conversion method as described herein. Further, the ASCR 1405 operates according to different methods for upsampling and downsampling under the control of the system controller 1430. That is, the system controller 1430 determine whether the input sample rate is above or below the output sample rate of the digital audio processor 1402, and issues a control signal to the ASCR 1405 accordingly. The output of ASRC 1405, which is at the sample rate the digital audio processor 1402, is applied to one input of the multiplexer 1406.

The digital audio receiver is also configured to receive analog audio signals. The analog-to-digital converter (ADC) 1404c converts analog stereo signals from analog line-in inputs CH_IN and from tuner 1413 to a digital data stream, and provides this data stream to another input of the multiplexer 1406. Because the sampling frequency of the ADC 1404c can be selected by the system designer, that sampling frequency will typically be selected to match the frequency at which the digital audio processor 1402 operates (e.g., 48 kHz), thus not requiring sample rate conversion. However, if the output of the ADC 1404c were at a different sample rate, these signals would also be applied to the ASRC 1405. The multiplexer 1406 chooses one (or both) of these inputs for application to the digital audio processor 1402, under the control of the system controller 1430.

The audio source selected by the ASRC 1405 and the multiplexer 1406 is under user control; in this regard, system controller 1430 receives direct selection inputs from the front panel switches 1425, or infrared remote control signals via the infrared receiver 1427, both communicating with the system controller 1430 via the interface circuitry 1428. As, system controller 1430 provides audio source selection signals to ASRC 1405 and multiplexer 1406, and channel volume control signals to PWM audio processor 20. The system controller 1430 also provides other control signals throughout the digital audio receiver, including channel selection control to the tuner 1406 in response to user inputs received via the front panel 1425 or the infrared receiver 1427, and operational control signals applied to digital audio processor 1402.

The digital audio processor 1402 is an integrated circuit, or integrated circuit core, for decoding and digitally processing the digital audio signals from the multiplexer 1406. Alternatively, the digital audio processor 1402 may be implemented as part of a larger-scale integrated circuit for decoding and processing digital video and audio signals. In either case, examples of functions performed by digital audio processor 1402 include decoding of the incoming digital data, applying the various digital audio data to corresponding channels supported by the digital audio receiver, applying digital filters, and formatting the digital audio data into a pulse-code-modulated (PCM) format. The PCM signals for each channel are then forwarded to the pulse-width-modulation (PWM) audio processor 1420. An additional interpolation function may be provided between the digital audio processor 1402 and the PWM audio processor 1420 (or included within PWM audio processor 1420) to increase the sample rate (e.g., by a factor of eight) to the desired pulse-width modulated frequency (e.g., 384 kHz).

The PWM audio processor 1420 converts the PCM digital audio signals at its inputs to corresponding pulse-width-modulated (PWM) signals output signals for four channels, in this example. For each of these four channels, the PWM audio processor 1420 produces separate PWM control signals that are applied to a corresponding power amplifier stage 1422a through 1422d, each of which drives a respective one of loudspeakers SPKR_1 through SPKR_4. More or fewer channels may be supported by the digital audio receiver. The PWM audio processor 1420 includes circuitry for controlling the volume of the audio output, performing the functions of parametric speaker equalization or "voicing", implementation of graphic equalizer presets, treble and bass adjustment, and precision soft volume control on the audio signal being processed for its channel. Other digital functions that can be performed by the PWM audio processor 1420 include loudness compensation to boost bass frequencies when the output for the channel is low, dynamic range compression, background noise floor compensation or noise squelch, center or sub-woofer channel synthesis, programmable dither, peak limiting and clipping, and other digital filter processing.

In FIG. 14, the digital audio processor 1402, the PWM audio processor 1420, and the ASRC 1405 are illustrated as separate functions. However, these digital functions may be integrated into a single integrated circuit.

Other Embodiments

While the invention has been described with respect to a limited number of embodiments, those skilled in the art, having benefit of this disclosure, will appreciate that other embodiments can be devised which do not depart from the scope of the invention as disclosed herein.

Embodiments of the invention may be performed in many different types of digital systems, e.g., digital audio players, personal computers, laptop computers, and table computers with multimedia capabilities, etc. In such digital systems, embodiments of the sample rate conversion systems and methods described herein may be implemented in hardware, software, firmware, or any combination thereof. The methods may be executed in one or more processors, such as a microprocessor, application specific integrated circuit (ASIC), field programmable gate array (FPGA), digital signal processor (DSP), or a system on a chip (SoC) combining one or more such processors with specialized programmable accelerators. Any software instructions may be stored in onboard or external memory and executed by the one or more processors.

It is therefore contemplated that the appended claims will cover any such modifications of the embodiments as fall within the true scope of the invention.

What is claimed is:

1. An audio system capable of performing a method for sample rate conversion of an input signal using a time-varying polyphase filter having a discrete polyphase index m, the method comprising:
   computing a discrete time index k at which an output sample is to be generated as a maximum integer result of Mt, wherein M is an oversampling ratio and t is a time of the output sample;
   mapping the discrete time index k to an input sample index T and the discrete polyphase index m wherein k=TM+m, wherein 0≤m<M; and
   applying a time-varying polyphase filter to an input sample at input sample index T to generate an output sample at the time index k, wherein the discrete polyphase index m is used to compute polynomial coefficients of the time-varying polyphase filter.

2. The audio system of claim 1, wherein applying the time-varying polyphase filter further comprises computing the polynomial coefficients using an iterated weighted least squares technique in which a weight function is updated at each iteration based on error in frequency response computed in a previous iteration, wherein stopband ripple is minimized.

3. The audio system of claim 2, wherein the time-varying polyphase filter allows droop in a passband that further minimizes the stopband ripple.

4. The audio system of claim 2, wherein using the iterated weighted least squares technique further comprises:
   solving N+1 order 2L simultaneous equations; and
   solving 2L order N+1 simultaneous equations using results of solving the N+1 order 2L simultaneous equations to determine the polynomial coefficients,
   wherein 2L is a length of the time-varying polyphase filter and N is an order of a polynomial of the time-varying polyphase filter.

5. The audio system claim 1, further comprising oversampling the input signal by a fixed ratio to narrow a bandwidth of the input signal with respect to Nyquist frequency before the computing a discrete time index.

6. The audio system of claim 5, further comprising applying an anti-aliasing filter to the input sample.

7. The audio system of claim 1, further comprising downsampling the output sample to a lower sample rate.

8. The audio system of claim 7, further comprising applying an anti-mirror filter to the downsampled output sample.

9. An audio system for sample rate conversion of an input signal using a time-varying polyphase filter having a continuous polyphase index τ, the method comprising:

determining an output sample time t;

mapping the output sample time t to an input sample index T and the continuous polyphase index $\tau$ wherein $t=T+\tau$, $0 \leq \tau < 1$; and applying a time-varying polyphase filter to an input sample at input sample index T to generate an output sample at the output sample time t, wherein the continuous polyphase index $\tau$ is used to compute polynomial coefficients of the time-varying polyphase filter.

10. The audio system of claim 9, wherein applying the time-varying polyphase filter further comprises computing the polynomial coefficients using an iterated weighted least squares technique in which a weight function is updated at each iteration based on error in frequency response computed in a previous iteration, wherein stopband ripple is minimized.

11. The audio system of claim 10, wherein the time-varying polyphase filter allows droop in a passband that further minimizes the stopband ripple.

12. The audio system of claim 10, wherein using the iterated weighted least squares technique further comprises:

solving N+1 order 2L simultaneous equations; and solving 2L order N+1 simultaneous equations using results of solving the N+1 order 2L simultaneous equations to determine the polynomial coefficients, wherein 2L is a length of the time-varying polyphase filter and N is an order of a polynomial of the time-varying polyphase filter.

13. The audio system of claim 9, further comprising oversampling the input signal by a fixed ratio to narrow a bandwidth of the input signal with respect to Nyquist frequency before the determining an output sample time.

14. The audio system of claim 13, further comprising applying an anti-aliasing filter to the input sample.

15. The audio system of claim 9, further comprising downsampling the output sample to a lower sample rate.

16. The audio system of claim 15, further comprising applying an anti-mirror filter to the downsampled output sample.

\* \* \* \* \*